United States Patent
Dey et al.

(10) Patent No.: US 9,112,465 B2
(45) Date of Patent: Aug. 18, 2015

(54) DIGITAL CALIBRATION OF PROGRAMMABLE GAIN AMPLIFIERS

(71) Applicants: Sanjoy K. Dey, Noida (IN); Mayank Jain, Ambala Cantt (IN)

(72) Inventors: Sanjoy K. Dey, Noida (IN); Mayank Jain, Ambala Cantt (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 63 days.

(21) Appl. No.: 14/067,994

(22) Filed: Oct. 31, 2013

(65) Prior Publication Data

US 2015/0116035 A1   Apr. 30, 2015

(51) Int. Cl.
*H03G 1/00* (2006.01)
*H03F 1/02* (2006.01)
*H03G 3/00* (2006.01)
*H03F 3/45* (2006.01)

(52) U.S. Cl.
CPC ......... *H03G 1/0088* (2013.01); *H03F 3/45475* (2013.01); *H03F 3/45977* (2013.01); *H03F 2200/321* (2013.01); *H03F 2203/45048* (2013.01); *H03F 2203/45528* (2013.01); *H03F 2203/45534* (2013.01); *H03F 2203/45536* (2013.01); *H03F 2203/45594* (2013.01); *H03F 2203/45616* (2013.01)

(58) Field of Classification Search
CPC .................. H03F 1/02; H03F 3/45071; H03F 2203/45528; H03F 2203/45534
USPC .......................... 330/9, 86, 282; 327/124, 307
See application file for complete search history.

(56) References Cited

U.S. PATENT DOCUMENTS

| | | | |
|---|---|---|---|
| 4,551,685 A * | 11/1985 | Kerns et al. | 330/86 |
| 6,459,335 B1 * | 10/2002 | Darmawaskita et al. | 330/9 |
| 6,552,593 B2 | 4/2003 | Blon et al. | |
| 7,295,061 B1 * | 11/2007 | Dasgupta | 330/9 |
| 7,302,246 B2 | 11/2007 | Tseng et al. | |
| 7,386,280 B2 | 6/2008 | Kappes et al. | |
| 7,831,223 B2 | 11/2010 | Kawashima | |
| 2010/0201423 A1 * | 8/2010 | Lo et al. | 327/307 |
| 2013/0154740 A1 * | 6/2013 | Xie | 330/260 |

* cited by examiner

*Primary Examiner* — Steven J. Mottola
*Assistant Examiner* — Hafizur Rahman
(74) *Attorney, Agent, or Firm* — Charles Bergere

(57) ABSTRACT

A programmable gain amplifier (PGA) includes an op amp, an input circuit, a feedback circuit, and a calibration circuit. The input circuit is connected between a PGA input node and an op-amp input node and selectively applies the analog input signal to the op-amp input node. The feedback circuit is connected between an op-amp output node and the op-amp input node and applies the amplified analog output signal as a feedback signal to the op-amp input node. The calibration circuit is connected between a calibration reference node and the op-amp input node and selectively connects the calibration reference node directly to the op-amp input node without traversing any of the input circuit. The PGA may be implemented as a single-ended or differential amplifier. The PGA avoids reduced linearity resulting from series combinations of switches in the input circuit when configured for its normal operating mode.

13 Claims, 1 Drawing Sheet

DIGITAL CALIBRATION OF PROGRAMMABLE GAIN AMPLIFIERS

BACKGROUND OF THE INVENTION

The present invention relates generally to electronic circuits and, more particularly, to programmable gain amplifiers.

FIG. 1 shows a schematic diagram of a conventional, single-ended programmable gain amplifier (PGA) (a.k.a. variable gain amplifier or VGA) 100, which receives analog input signal Vin and generates amplified analog output signal Vout. The gain of the PGA 100 is programmably set by closing one or both of input switches S1 and S2 to select a particular level for the input resistance applied to operational amplifier (op amp) 102 based on one or both of input resistors Ri1 and Ri2, and closing one or both of feedback switches S3 and S4 to select a particular level for the feedback resistance applied to the op amp 102 based on one or both of feedback resistors Rf1 and Rf2.

To configure the PGA 100 for normal operating mode, switch Sc is opened and switch Scb is closed such that input signal Vin is applied via the input resistance to the op amp 102. To configure the PGA 100 for calibration mode, switch Scb is open and switch Sc is closed such that the amplifier input is tied to ground through the input resistance. In this calibration mode configuration, the amplifier output signal Vout indicates the DC offset of the PGA 100. This DC offset value can be digitized, e.g., by an analog-to-digital converter (ADC) (not shown in FIG. 1) and retained, e.g., in the memory of a digital signal processor (DSP) (not shown in FIG. 1) and used by the DSP during the normal operating mode, e.g., by subtracting the stored digital DC offset value from the digitized output of the ADC corresponding to the amplifier output signal Vout.

Each additional series switch in the PGA 100 adversely affects its linearity and therefore the linearity of a system containing the PGA 100.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components.

One embodiment of the invention is circuitry comprising a programmable gain amplifier (PGA) that generates an amplified analog output signal at a PGA output node of the PGA based on an analog input signal applied to a PGA input node of the PGA. The PGA includes an operational amplifier (op amp), input circuitry, feedback circuitry, and calibration circuitry.

The op amp comprises first and second op-amp input nodes and at least a first op-amp output node. The input circuitry is connected between the PGA input node and the first op-amp input node and is configurable to selectively apply the analog input signal to the first op-amp input node. The feedback circuitry is connected between the first op-amp output node and the first op-amp input node and is configured to apply the amplified analog output signal as a feedback signal to the first op-amp input node. The calibration circuitry is connected between a calibration reference node and the first op-amp input node and is configurable to selectively connect the calibration reference node directly to the first op-amp input node.

Figure 2:
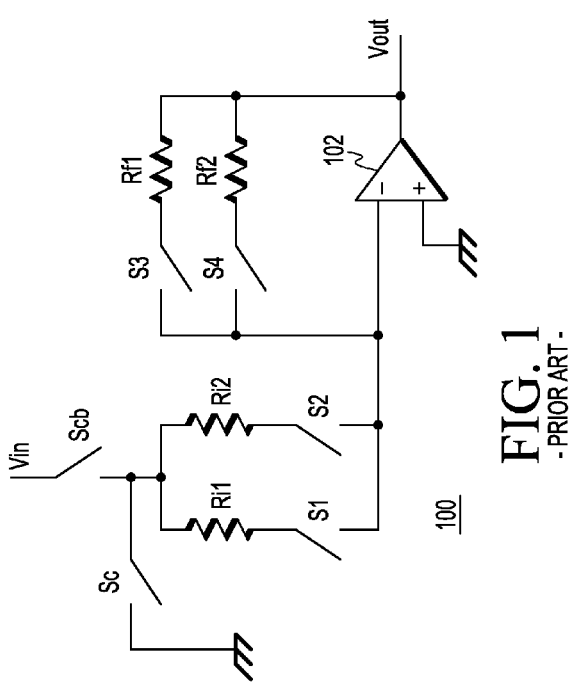
FIG. 2 is a schematic diagram of a single-ended programmable gain amplifier according to one embodiment of the present invention.

Referring now to FIG. 2, a schematic diagram of a single-ended programmable gain amplifier (PGA) 200, according to one exemplary embodiment of the invention, which receives analog input signal Vin and generates amplified analog output signal Vout is shown. The PGA 200 comprises an op amp 202, input circuitry including input resistors Ri1 and Ri2 and switches S1 and S2, feedback circuitry including feedback resistors Rf1 and Rf2 and switches S3 and S4, and calibration circuitry including calibration resistor R_calib and calibration switch Sc that selectively connects the negative input node of the op amp 202 to a calibration reference node (i.e., ground).

Figure 1:
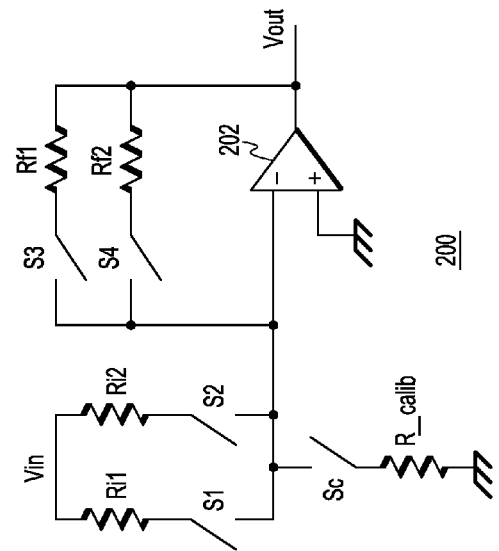
FIG. 1 is a schematic diagram of a conventional, single-ended programmable gain amplifier.

Unlike the PGA 100 of FIG. 1, in which the calibration reference node is selectively connected to the negative input node of the op amp 102 through the input circuitry of the input resistors Ri1 and/or Ri2 and switches S1 and/or S2, in the PGA 200, the calibration reference node is selectively connected directly to the negative input node of the op amp 202, i.e., without traversing any of the input circuitry.

Like the PGA 100 of FIG. 1, for the normal operating mode, the gain of the PGA 200 is programmably set by closing one or both of input switches S1 and S2 to select a particular level for the input resistance applied to the op amp 202 based on one or both of input resistors Ri1 and Ri2, and closing one or both of the feedback switches S3 and S4 to select a particular level for the feedback resistance applied to the op amp 202 based on one or both of the feedback resistors Rf1 and Rf2. Note that, during the normal operating mode, calibration switch Sc is open.

Unlike the PGA 100, however, for the calibration mode of the PGA 200, switches S1 and S2 are both open, and calibration switch Sc is closed such that the amplifier input is tied to ground via calibration resistor R_calib. In this calibration configuration, the amplifier output signal Vout indicates the DC offset of the PGA 200. Similar to the PGA 100, this DC offset value can be retained and used during normal operations, e.g., by subtracting the stored DC offset value from the amplifier output Vout.

Because the PGA 200 has a separate calibration branch (comprising calibration switch Sc and calibration resistor R_calib), during the normal operating mode, there is only one series switch between the PGA input Vin and the negative input to the op amp 202. As such, the PGA 200 avoids the linearity problem associated with the extra series switch that exists in the PGA 100.

Each series combination of a switch and a resistor in FIG. 2 may be referred to generically as a switched resistor. Thus, in the exemplary PGA 200, the input circuitry may be said to have two switched input resistors Ri1 and Rig connected in parallel, while the feedback circuitry has two switched feedback resistors Rf1 and Rf2 connected in parallel. In other implementations of the present invention, the input circuitry may have any number of switched input resistors connected in parallel, including possibly only one switched input resistor. Similarly, the feedback circuitry may have any (possibly different) number of switched feedback resistors connected in parallel, including possibly only one feedback resistor. Note that, if there is only one feedback resistor, then it does not need to be a switched resistor. Similarly, even when there are multiple feedback resistors connected in parallel, they do not all have to be switched resistors.

Similarly, although the calibration circuitry is shown as having a single switched resistor, in alternative embodiments, the calibration circuitry could have two or more switched resistors connected in parallel. In such embodiments, the PGA can be calibrated at different gain settings by selectively configuring different combinations of calibration resistors for the calibration mode.

Although the calibration circuitry in FIG. 2 is terminated at a ground reference voltage, those skilled in the art will understand that, in other implementations, the calibration branch can be terminated at a DC reference voltage level other than ground.

Those skilled in the art will understand that the order of the switch and the resistor in each switched-resistor branch of the PGA 200 can be reversed, although the configuration shown in FIG. 2 is preferred due to its improved linearity.

Although the PGA 200 is a single-ended amplifier, those skilled in the art will understand that the invention can be extended to implement a differential amplifier, e.g., by connecting two sets of input, feedback, and calibration circuitries analogous to that of FIG. 2 to a differential version of the op amp 202 to form a differential PGA receiving a differential input signal Vinp, Vinm and generating an amplified differential output signal Voutp, Voutm. During the calibration mode, both PGA input nodes would be tied to the same reference voltage (e.g., ground).

Figure 3:
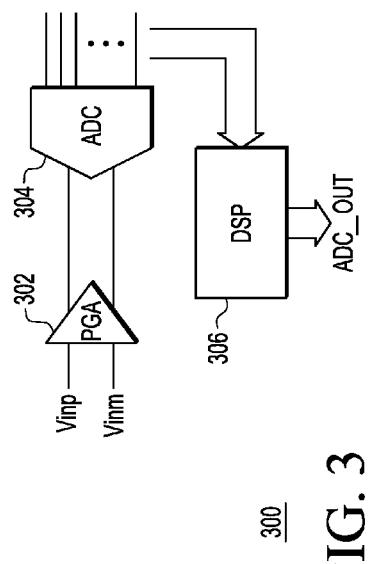
FIG. 3 is a block diagram of a system employing a differential version of the PGA of FIG. 2.

FIG. 3 is a block diagram of a system 300 employing a differential version 302 of the PGA 200 of FIG. 2. In addition to differential PGA 302, the system 300 includes an analog-to-digital converter (ADC) 304 and a digital signal processor (DSP) 306.

In operation, differential analog input signal Vinp, Vinm is amplified by the differential PGA 302, the resulting amplified differential analog signal is digitized by the ADC 304, and the resulting differential digital signal is processed by the DSP 306 to generate the digital output signal ADC_OUT.

In order to calibrate the DC offset of the differential PGA 302, the differential PGA 302 is configured in its calibration mode analogous to that described above for the calibration mode of the PGA 200, and the digitized output from the ADC 304 is retained by the DSP 306 as a digital measurement of the DC offset. For normal operations, the differential PGA 302 is configured in its normal operating mode analogous to that described above for the normal operating mode of the PGA 200, and the digitized output from the ADC 304 is adjusted by the DSP 306, e.g., by subtracting the retained digital DC offset value, to generate the digital output signal ADC_OUT.

As with the single-ended PGA 200, the differential PGA 302 is designed to support digital calibration, while avoiding the linearity problem associated with series combinations of switches in its input circuitry when configured for its normal operating mode.

The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non enabled embodiments and embodiments that correspond to non statutory subject matter are explicitly disclaimed even if they fall within the scope of the claims.

The invention claimed is:

1. A circuit including a programmable gain amplifier (PGA) that generates an amplified analog output signal at a PGA output node of the PGA based on an analog input signal applied to a PGA input node of the PGA, the PGA comprising:

an operational amplifier (op amp) comprising first and second op-amp input nodes and at least a first op-amp output node;

an input circuit connected between the PGA input node and the first op-amp input node and configurable to selectively apply the analog input signal to the first op-amp input node;

a feedback circuit connected between the first op-amp output node and the first op-amp input node and configured to apply the amplified analog output signal as a feedback signal to the first op-amp input node; and a calibration circuit connected between a calibration reference node and the first op-amp input node and configurable to selectively connect the calibration reference node directly to the first op-amp input node, wherein:
for a PGA normal operating mode, (i) the input circuit is configured to connect the PGA input node to the first op-amp input node such that the analog input signal is applied to the first op-amp input node and (ii) the calibration circuit is configured to disconnect the calibration reference node from the first op-amp input node; and for a PGA calibration mode, (i) the input circuit is configured to disconnect the PGA input node from the first op-amp input node such that the analog input signal is not applied to the first op-amp input node and (ii) the calibration circuit is configured to connect the calibration reference node directly to the first op-amp input node.

2. The circuit of claim 1, wherein when the PGA is configured in the PGA normal operating mode, no signal path from the PGA input node to the first op-amp input node contains two or more switches connected in series.

3. The circuit of claim 2, wherein when the PGA is configured in the PGA normal operating mode, each signal path from the PGA input node to the first op-amp input node contains only one switch.

4. The circuit of claim 1, wherein the PGA is a differential PGA configured to generate an amplified differential analog output signal at a differential PGA output node of the differential PGA based on a differential analog input signal applied to a differential PGA input node of the differential PGA, wherein:
the op amp is a differential op amp comprising the first and second op-amp input nodes and the first and a second op-amp output node;
the input circuit is connected between the differential PGA input node and the first and second op-amp input nodes and configurable to selectively apply the differential analog input signal to the first and second op-amp input nodes;
the feedback circuit is connected between the first and second op-amp output nodes and the first and second op-amp input nodes and configured to apply the amplified differential analog output signal as a differential feedback signal to the first and second op-amp input nodes; and
the calibration circuit is connected between a differential calibration reference node and the first and second op-amp input nodes and configurable to selectively connect the differential calibration reference node directly to the first and second op-amp input nodes.

5. The circuit of claim 1, wherein:
the input circuit comprises two or more switched resistors connected in parallel;
the feedback circuit comprises two or more resistors connected in parallel, wherein at least one of the resistors is a switched resistor; and
the calibration circuit comprises a switched resistor.

6. The circuit of claim 5, wherein each resistor in the feedback circuit is a switched resistor.

7. The circuit of claim 1, wherein the calibration reference node is connected to ground.

8. The circuit of claim 1, further comprising:
an analog-to-digital converter (ADC) configured to digitize the amplified analog output signal generated by the PGA; and
a digital signal processor (DSP) configured to (i) characterize a DC offset value for the PGA based on a digitized signal from the ADC during the PGA calibration mode and (ii) compensate for the DC offset value in the digitized signal during the PGA normal operating mode.

9. A programmable gain amplifier (PGA) that generates an amplified analog output signal at a PGA output node based on an analog input signal applied to a PGA input node, the PGA comprising:
an operational amplifier (op amp) including first and second op-amp input nodes and an op-amp output node;
an input circuit, comprising two or more switched resistors connected in parallel, connected between the PGA input node and the first op-amp input node, wherein the input circuit selectively applies the analog input signal to the first op-amp input node;
a feedback circuit, comprising two or more resistors connected in parallel, connected between the op-amp output node and the first op-amp input node, wherein the feedback circuit applies the amplified analog output signal as a feedback signal to the first op-amp input node; and
a calibration circuit comprising a switched resistor connected between a calibration reference node and the first op-amp input node, wherein the calibration circuit selectively connects the calibration reference node directly to the first op-amp input node, wherein
for a PGA normal operating mode, (i) the input circuit is configured to connect the PGA input node to the first op-amp input node such that the analog input signal is applied to the first op-amp input node and (ii) the calibration circuit is configured to disconnect the calibration reference node from the first op-amp input node; and
for a PGA calibration mode, (i) the input circuit is configured to disconnect the PGA input node from the first op-amp input node such that the analog input signal is not applied to the first op-amp input node and (ii) the calibration circuit is configured to connect the calibration reference node directly to the first op-amp input node.

10. The PGA of claim 9, wherein at least one of the resistors of the feedback circuit is a switched resistor.

11. The PGA of claim 9, wherein each resistor in the feedback circuit is a switched resistor.

12. The PGA of claim 9, wherein when the PGA is configured in the PGA normal operating mode, no signal path from the PGA input node to the first op-amp input node contains two or more switches connected in series.

13. The PGA of claim 12, wherein when the PGA is configured in the PGA normal operating mode, each signal path from the PGA input node to the first op-amp input node contains only one switch.

* * * * *